United States Patent [19]

Hatanaka

[11] Patent Number: 5,331,279

[45] Date of Patent: Jul. 19, 1994

[54] METHOD AND APPARATUS FOR IMAGING BLOOD VESSELS EMPLOYING MAGNETIC RESONANCE

[75] Inventor: Masahiko Hatanaka, Tochigi, Japan

[73] Assignee: Kabushiki Kaisha Toshiba, Kawasaki, Japan

[21] Appl. No.: 109,452

[22] Filed: Aug. 19, 1993

Related U.S. Application Data

[63] Continuation of Ser. No. 672,047, Mar. 18, 1991, abandoned.

[30] Foreign Application Priority Data

Mar. 20, 1990 [JP] Japan ................................. 2-71022
Mar. 23, 1990 [JP] Japan ................................. 2-72003

[51] Int. Cl.$^5$ ............................................. G01R 33/20
[52] U.S. Cl. ................................. 324/306; 324/309; 128/653.3
[58] Field of Search .............. 324/306, 300, 307, 309; 128/653.2, 653.3

[56] References Cited

U.S. PATENT DOCUMENTS

| | | | |
|---|---|---|---|
| 4,570,119 | 2/1986 | Wehrli | 324/306 |
| 4,602,641 | 7/1986 | Feinberg | 128/653.3 |
| 4,689,560 | 8/1987 | Nayler et al. | 324/306 |
| 4,739,766 | 5/1988 | Riederer | 128/653.3 |
| 4,777,957 | 10/1988 | Wehrli et al. | 324/306 |
| 4,782,839 | 11/1988 | Hennig et al. | 128/653.3 |
| 4,796,635 | 1/1989 | Dumoulin | 128/653.3 |
| 4,800,889 | 1/1989 | Dumoulin | 324/306 |
| 4,836,209 | 6/1989 | Nishimura | 324/306 |
| 4,849,697 | 7/1989 | Cline et al. | 324/306 |
| 4,947,837 | 8/1990 | Sano | 128/653.3 |
| 5,031,624 | 7/1991 | Mistretta et al. | 324/306 |
| 5,034,694 | 7/1991 | Sattin et al. | 324/309 |

*Primary Examiner*—Michael J. Tokar
*Assistant Examiner*—Raymond Y. Mah
*Attorney, Agent, or Firm*—Limbach & Limbach

[57] ABSTRACT

A magnetic resonance blood flow imaging method employs a field-echo technique and a gapless multi-slice acquisition technique in which a selective excitation pulse with a flip angle of less than 90 degrees is utilized and a pulse repetition time is set shorter than usual. Imaging data are acquired from multiple slices of a subject under examination while the multiple slices are shifted in sequence in position. A cross-sectional image is reconstructed for each of the multiple slices. Images obtained by performing subtractions on plural images for the same slice are gathered to thereby produce an image of blood vessels of the subject under examination which contain at least two blood vessels which run substantially in parallel and are opposite to each other in the direction of blood flow therein.

9 Claims, 13 Drawing Sheets

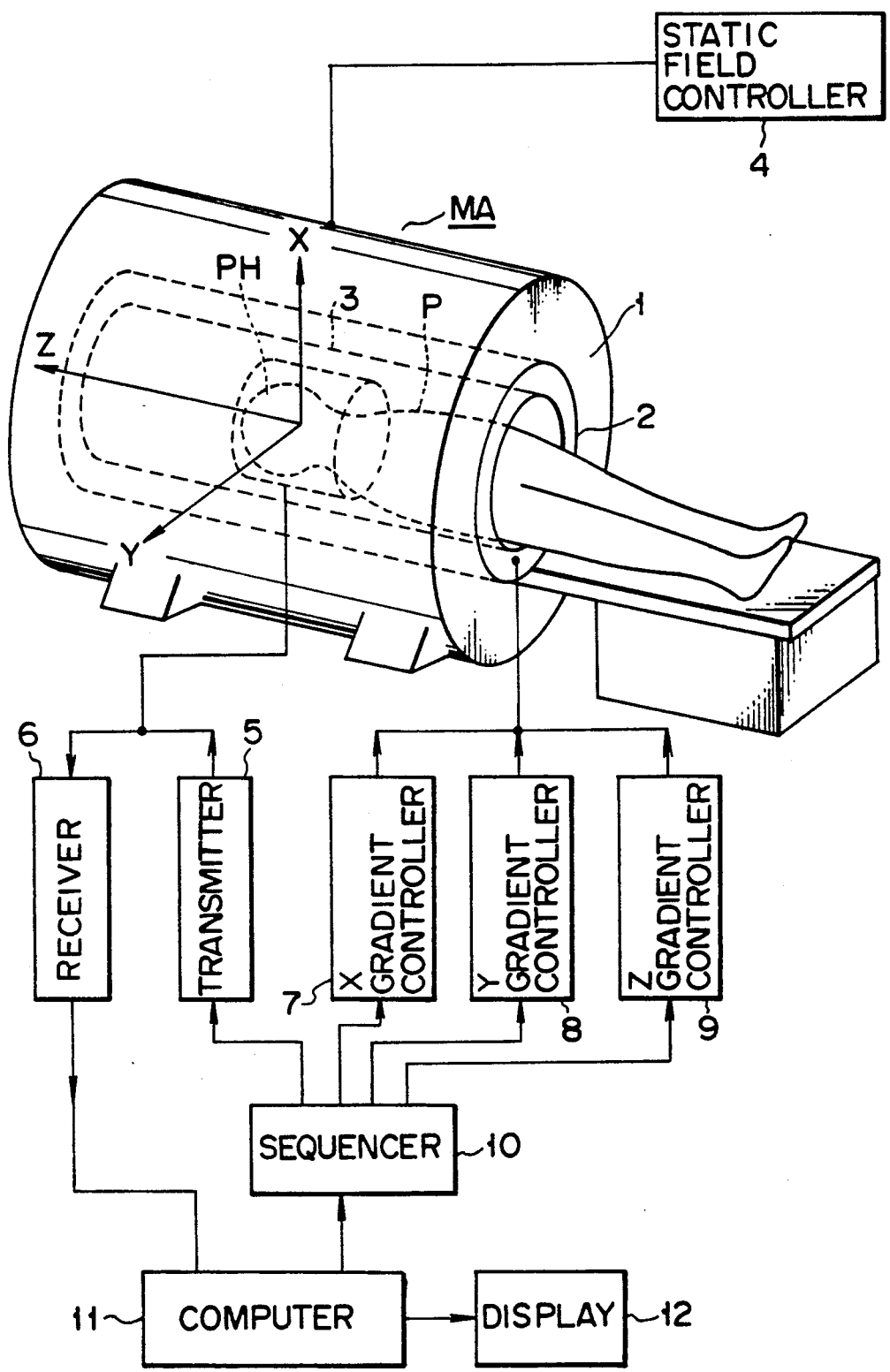
F I G. 2

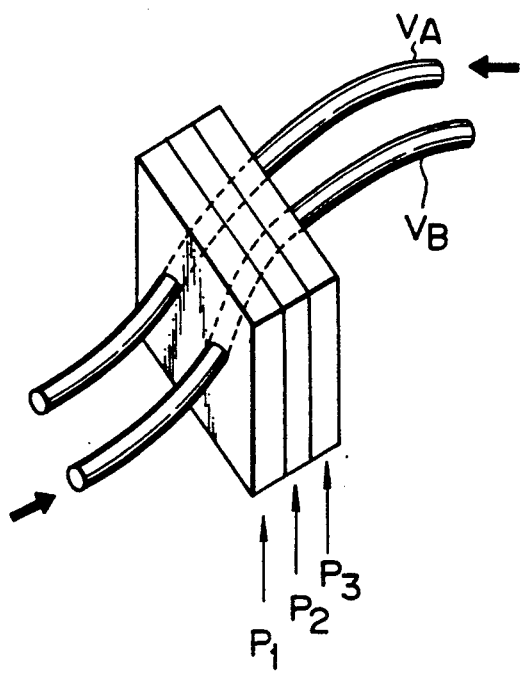
F I G. 4
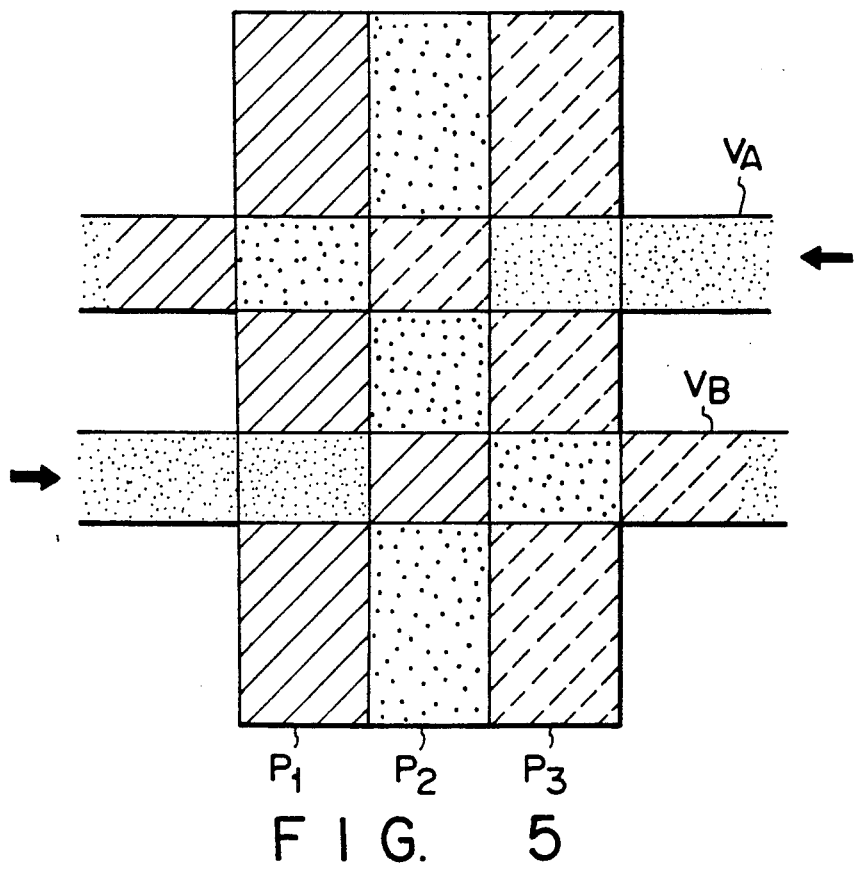
F I G. 5

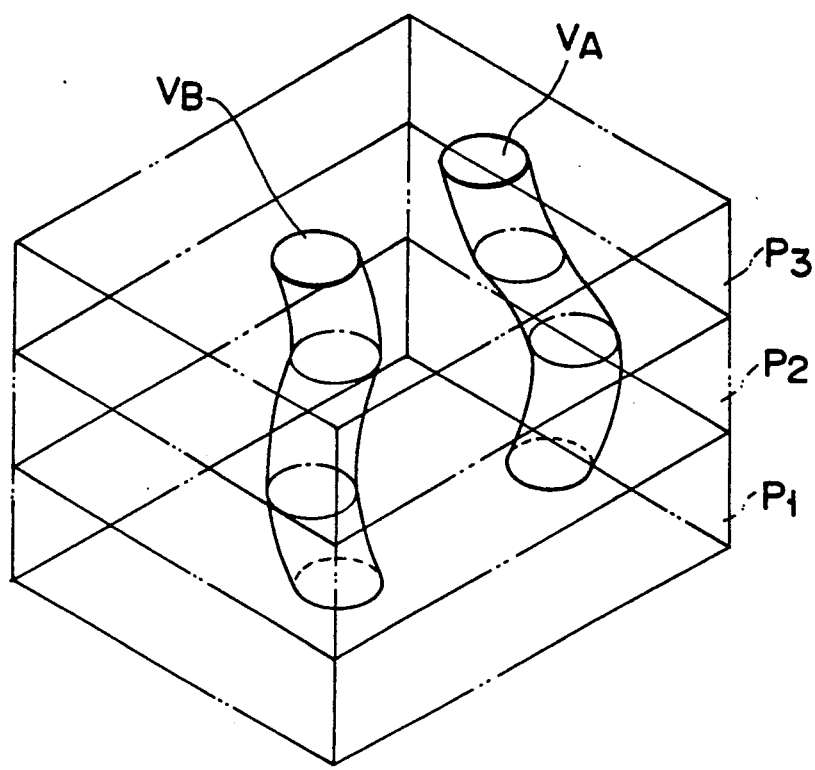
F I G. 8

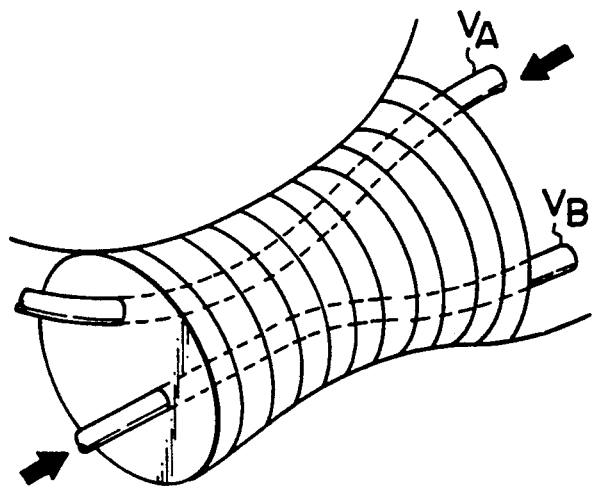
F I G. 15
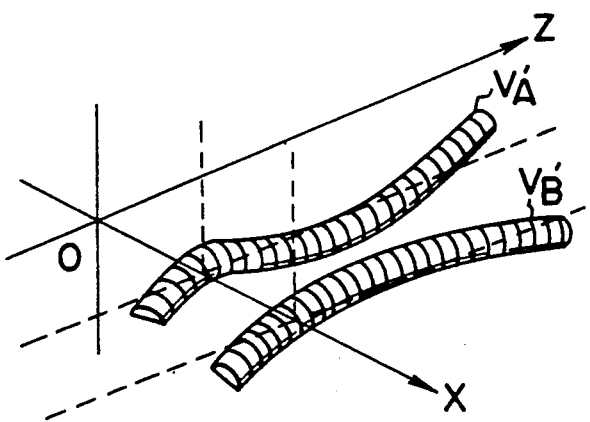
F I G. 16

METHOD AND APPARATUS FOR IMAGING BLOOD VESSELS EMPLOYING MAGNETIC RESONANCE

This is a continuation of co-pending application Ser. No. 07/672,047 filed on Mar. 18, 1991, now abandoned.

BACKGROUND OF THE INVENTION

1. Field of the Invention

The present invention relates to a method and apparatus for imaging blood vessels employing magnetic resonance and, more specifically, to an imaging method and apparatus which permit visualization of only arteries, only veins or both the arteries and veins.

2. Description of the Related Art

A description will be made of a conventional method of imaging blood vessels, which is generally referred to as magnetic resonance (MR) angiography. As shown in FIG. 1, let us imagine a slice P which is perpendicular to the direction in which a blood vessel V runs. A radio frequency (RF) pulse-is applied to the slice P to excite it. Then, the entire slice is excited. In this case, fresh blood which has not been subjected to the RF pulse flows into the blood vessel V in the slice P. For this reason an MR signal at a high level will be generated from the blood vessel V. Since, in this case, fresh blood flows into the vessel with each repetition of the RF pulse, a phenomenon will occur in which a high-level MR signal is produced each time an RF pulse is applied. This is generally referred to as the time-of-flight phenomenon. Also, there is a phenomenon in which the phase of the MR signal varies because of the flow of blood. This is generally referred to as the phase modulation phenomenon. There is a method which employs these phenomena to obtain MR angiograms.

Besides the above methods, there is the following method. First, in this method, a single-slice pulse sequence whose pulse repetition period Tr is short is adopted. In executing this pulse sequence a plurality of slices are excited in sequence for visualization of plural regions. During this process a saturation phenomenon due to the short repetition period and the time-of-flight phenomenon act, whereby the amount of generation of MR signals from static portions becomes small and eventually high-level MR signals are obtained selectively from flowing blood, so that MR angiograms are obtained.

Every one of the above-described conventional methods permits presentation of desirable angiograms for blood flow (blood vessels) in one direction. However, in the case where an artery and a vein are mixed, blood flow in one direction and blood flow in the other direction cannot be separated from each other. For this reason the artery and the vein are presented together. Thus, they are hardly distinguishable from each other and the blood flow is also difficult to understand properly.

SUMMARY OF THE INVENTION

It is therefore an object of the present invention to provide an MR blood flow imaging method and apparatus which permit presentation of MR angiograms for only arteries, only veins or both arteries and veins.

The above object is attained by a blood vessel imaging method employing magnetic resonance comprising the steps of:

acquiring magnetic resonance signals from multiple slice regions of a subject under examination;

reconstructing cross-sectional images of said slice regions on the basis of said magnetic resonance signals from said slice regions obtained by the step of acquiring; and performing arithmetic operations on said cross-sectional images of said slice regions to thereby produce an image of blood vessels within said subject.

The above object is attained by a blood vessel imaging apparatus employing magnetic resonance comprising:

acquiring means for acquiring magnetic resonance signals from multiple slice regions of a subject under examination;

reconstructing means for reconstructing cross-sectional images of said slice regions from said magnetic resonance signals from said slice regions obtained by said acquiring means; and processing means for performing arithmetic operations on said cross-sectional images of said slice regions to thereby produce an image of blood vessels within said subject.

The above object is attained by a blood vessel imaging method employing magnetic resonance comprising the steps of:

acquiring magnetic resonance signals from multiple slice regions of a subject under examination as projection data in a specific direction;

reconstructing projection images of said slice regions on the basis of said projection data of said slice regions obtained by the step of acquiring; and performing arithmetic operations on said reconstructed projection images of said slice regions to thereby produce an image of blood vessels within said subject.

The above object is attained by a blood vessel imaging apparatus employing magnetic resonance comprising:

acquiring means for acquiring magnetic resonance signals from multiple slice regions of a subject under examination as projection data in a specific direction;

reconstructing means for reconstructing projection images of said slice regions from said projection data of said slice regions obtained by said acquiring means; and processing means for performing arithmetic operations on said reconstructed images of said slice regions to thereby produce an image of blood vessels within said subject.

The above blood flow imaging method and apparatus of the present invention functions as follows. Imaging of a subject under examination by means of a multi-slice acquisition technique permits images of blood vessels due to the occurrence of the time of flight phenomenon to be produced in cross-sectional images or projection images of the subject. By performing an arithmetic operation, such as addition or subtraction, on the cross-sectional images or projection images, blood vessels in one flow direction, namely only arteries or veins, or blood vessels in opposite flow directions, namely, both the arteries and veins, can be imaged.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 2 illustrates an electrical arrangement of a usual magnetic resonance imaging apparatus;

FIG. 4 is a diagrammatic representation of regions to be imaged according to the pulse sequences shown in FIG. 3;

FIG. 5 is a diagram illustrating signal acquisition in the regions P1, P2 and P3 of FIG. 4;

FIG. 8 illustrates a three-dimensional image of blood vessels produced by the first embodiment;

FIGS. 15 and 16 illustrate a projection image of FIG. 14.

DETAILED DESCRIPTION OF THE PREFERRED EMBODIMENTS

Figure 1:
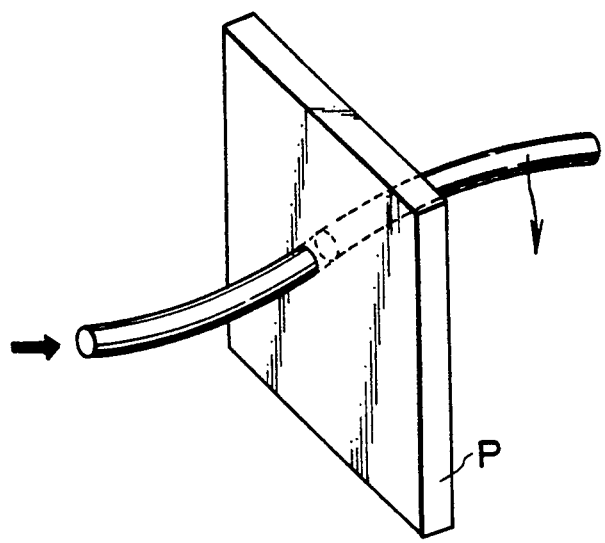
FIG. 1 is a diagram illustrating a prior art.

Hereinafter magnetic resonance angiography according to an embodiment of the present invention will be described with reference to the accompanying drawings.

First, the arrangement of a magnetic resonance imaging apparatus which can carry out the method of the present invention will be described. As shown in FIG. 2, a magnet assembly MA which accommodate a subject under examination or patient P comprises a static-field magnet system 1 employing a superconducting magnet, a non-superconducting magnet, a permanent magnet or a combination of these magnets, an X-, Y- and Z-axis gradient field generating coil system 2 for generating gradient magnetic fields used to provide position information of a region in which magnetic resonance signals are induced and a probe 3, consisting of, for example, a transmit coil and a receive coil, which is a transmit and receive system adapted to transmit an RF excitation pulse and detect induced magnetic resonance signals (MR signals: echo signals or FID signals).

The static-field magnet 1 is controlled by a static field controller 4.

Figure 3:
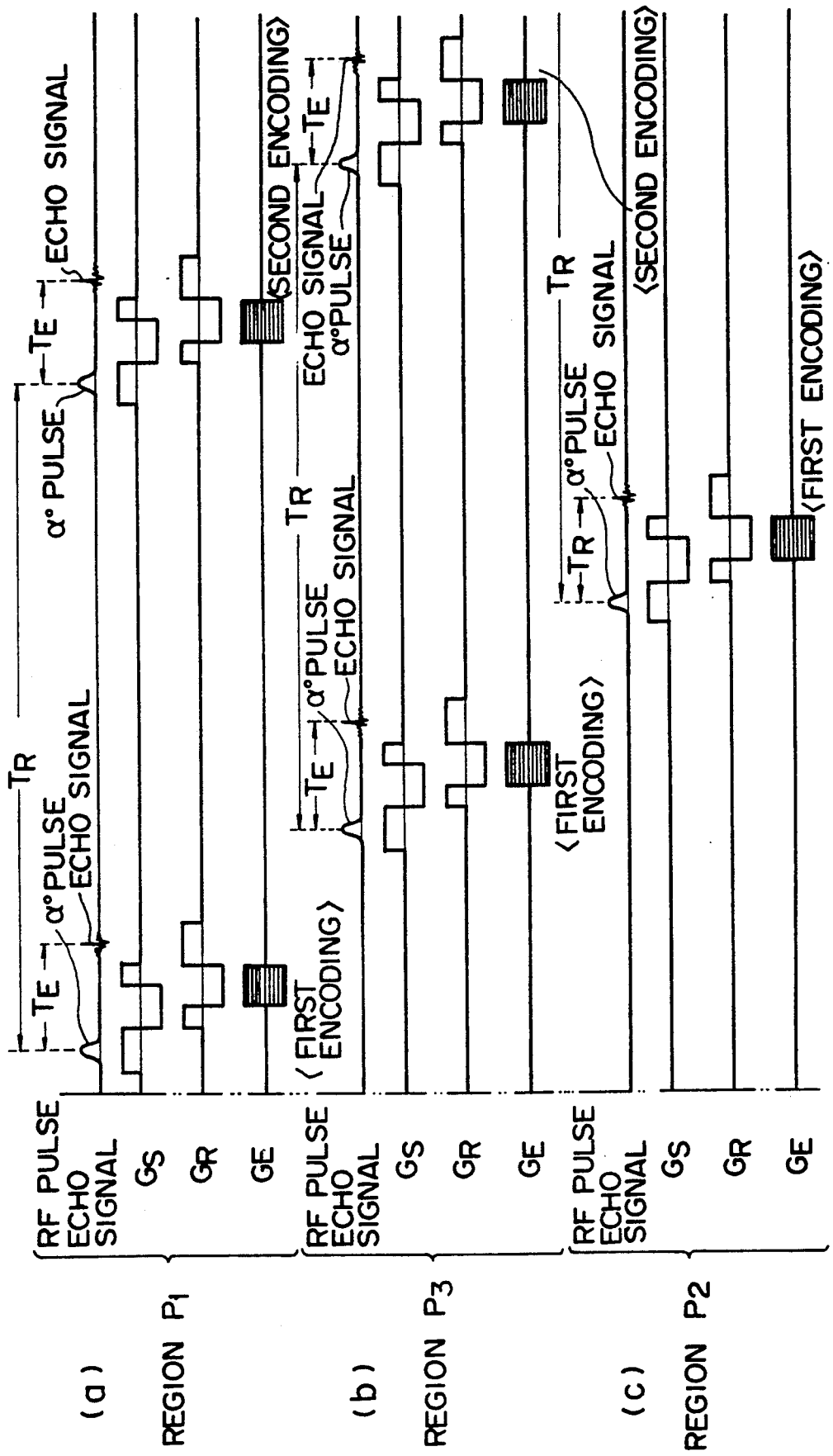
FIG. 3 illustrates pulse sequences for carrying out a method according to a first embodiment of the present invention.
Figure 9:
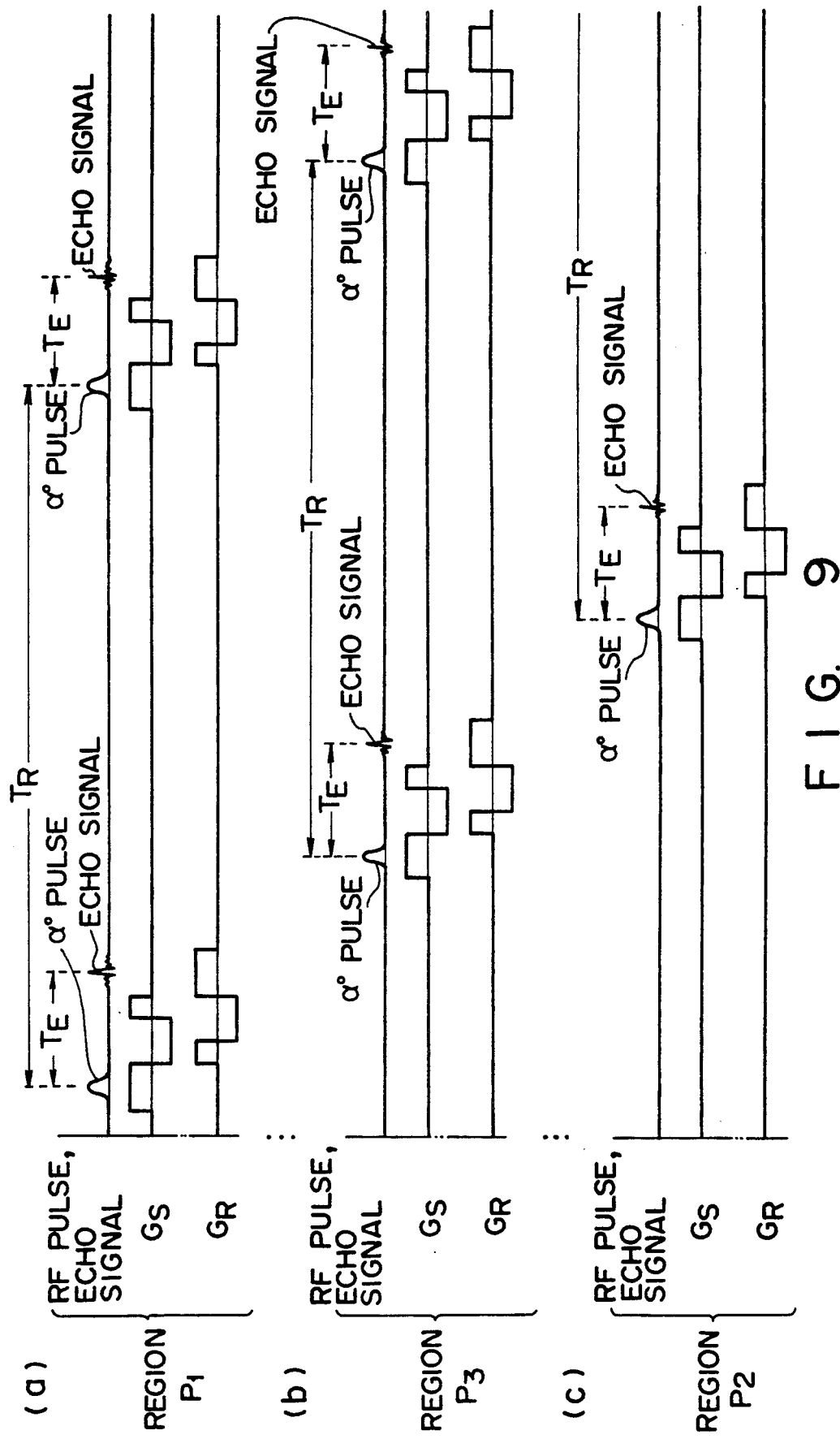
FIG. 9 illustrates pulse sequences for carrying out a method according to a second embodiment of the present invention.

In addition to the magnet assembly MA, the magnetic resonance imaging apparatus includes a transmitter 5 for controlling the transmission of the RF pulse, a receiver 6 for controlling the reception of the induced MR signals, X-axis, Y- and Z-axis gradient field controllers 7, 8 and 9 for controlling the X-, Y- and Z-axis gradient field generating coils 2, a sequencer 10 adapted to carry out not only usual pulse sequences for spin-echo and field-echo imaging but also pulse sequences embodying the present invention which are shown in FIG. 3 or 9, a computer system 11 for controlling these components and processing and displaying detected signals, and a display 12 for displaying images reconstructed by the computer system 11.

Here the pulse sequences are carried out by the sequencer 10 under the circumstances that the subject P is placed in a static magnetic field. That is, the transmitter 5 is driven so that an RF pulse ($\alpha°$ pulse or 90° pulse as a selective excitation RF pulse, 180° pulse as a non-selective excitation RF pulse) is applied from the transmit coil to the subject P, the gradient field power supplies 7, 8 and 9 are driven so that a slice-selection gradient field Gx, a phase encoding gradient field Gy and a readout gradient field Gz are applied from the gradient field forming coils 2 to the subject P, and signals from a specific region of the subject P are received by the receive coil of the probe 3. The pulse sequences shown in FIG. 3 or 9 are repeated a predetermined number of times, thereby obtaining a group of data (MR signals) for imaging.

At this point an imaging region in the present embodiment will be described with reference to FIG. 4. In the imaging region there are two blood vessels VA and VB which run substantially in parallel and which are opposite to each other in blood flow direction. For example, a region may be imagined in which an artery and a vein run substantially in parallel. Let us imagine three vertical slice regions P1, P2 and P3 which are substantially perpendicular to the blood vessels VA and VB and that the three slice regions are photographed using a multi-slice acquisition technique. In this case it is assumed that the regions are excited in the order of P1, P3 and P2. This excitation technique is referred to as a gapless multi-slice acquisition technique.

Next, the excitation and acquisition procedure for the above-described imaging regions is carried out in accordance with timing steps of a field-echo pulse sequence, as shown in FIG. 3. That is, the excitation of the regions is effected in the order of P1, P3 and P2. The region P1 is subjected to the first encoding first, the region P3 is subjected to the first encoding next and the region P2 is subjected to the first encoding finally. Then, the regions are subjected to the second encoding in the order of P1, P3 and P2. Each of the first and second encoding is repeated a predetermined number of times. Note that the pulse repetition period TR in the pulse sequence is set short. To improve the S/N ratio, the RF pulse ($\alpha°$ pulse) preferably has a flip angle of less than 90°.

At this point, as an example, data acquisition in the slice region P1 will be described with reference to FIG. 5. In FIG. 5, a portion indicated by oblique solid lines is a region to be excited this time, i.e., the slice region P1. A portion indicated by oblique broken lines is a region which was excited last time, i.e., the slice region P3 in a previous sequence using a different phase encoding. Moreover, a portion indicated by large dots is a region which was excited last time in a previous sequence using a different phase encoding, i.e., the slice region P2. Furthermore, portions indicated by small dots represent those which have not been excited.

Figure 6A:
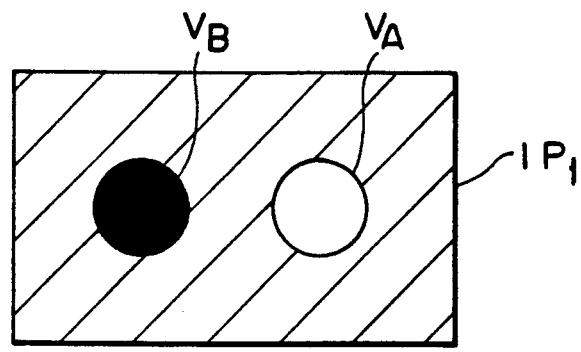
FIGS. 6A, 6B and 6C are diagrammatic representations of images obtained from the regions P1, P2 and P3.

As can be seen from the foregoing, the image IP1 associated with the region P1 will involve a relatively low-level signal from the blood vessel VA and a relatively high-level signal from the blood vessel VB. The reason is that, because of the short pulse repetition time TR, blood which has been excited in the region P2 flows into that portion of the blood vessel VA which is located in the region P1 and moreover it provides a relatively low-level signal at the time of signal acquisition, and fresh blood which has not been excited elsewhere flows into that portion of the blood vessel VB which is located in the region P1 and moreover it provides a high-level signal at the time of signal acquisition. The image IP1 is shown in FIG. 6 in which the black round mark indicates the high-level signal, while the white round mark indicates the low-level signal.

Figure 6B:
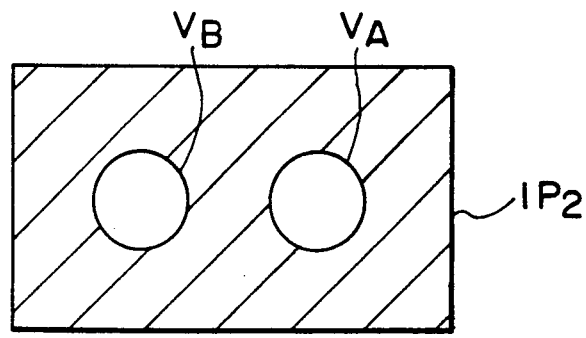

In the image IP2 associated with the region P2, the signals from the blood vessels VA and VB are both at a low level. This is because blood which has been excited in the region P3 flows into that portion of the blood vessel VA which is located in the region P2 and moreover it provides a low level signal at the time of signal acquisition, and blood which has been excited in the region P1 flows into that portion of the blood vessel VB which is located in the region P2 and moreover it provides a relatively low-level signal at the time of signal acquisition. This is due to the short pulse repetition time TR. The image IP2 is shown in FIG. 6B in which, as in FIG. 6A, the black round mark indicates a high-level signal, while the white round mark indicates a low-level signal.

Figure 6C:
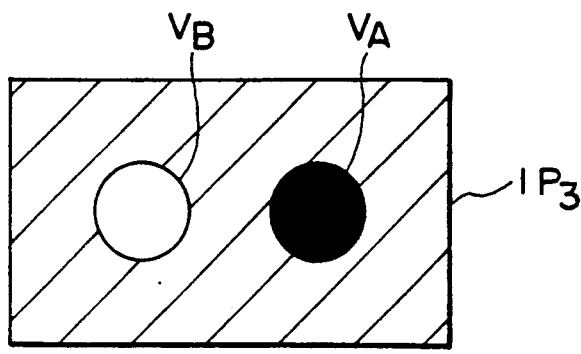

Furthermore, the image IP3 associated with the region P3 involves a high-level signal from the blood vessel VA and a relatively low-level signal from the blood vessel VB. The reason is that fresh blood which has not been excited elsewhere flows into that portion of the blood vessel VA which is located in the region P3 and moreover it provides a high-level signal at the time of signal acquisition, and blood which has been excited in the region P1 flows into that portion of the blood vessel VB which is located in the region P3 and moreover it provides a relatively low-level signal at the time of signal acquisition. This is also due to the short pulse repetition time TR. The image IP3 is shown in FIG. 6C in which, as in FIGS. 6A and 6B, the black round mark indicates the high-level signal, while the white round mark indicates the low-level signal.

Next, the starting position for the multi-slice acquisition is shifted one slice for the subsequent excitation and data acquisition procedure. Namely, the same multi-slice acquisition as that described above is carried out from the region P2.

Figure 7A:
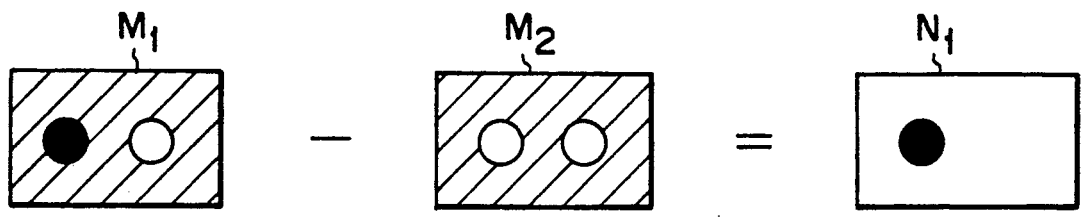
FIGS. 7A, 7B, 7C and 7D are diagrams illustrating subtraction processes for blood-vessel imaging according to the first embodiment.
Figure 7B:
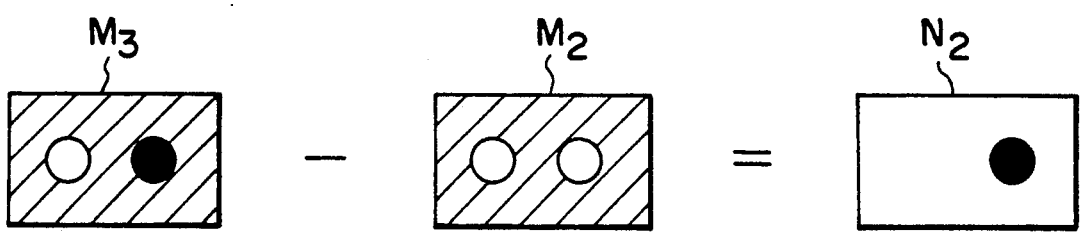
Figure 7C:
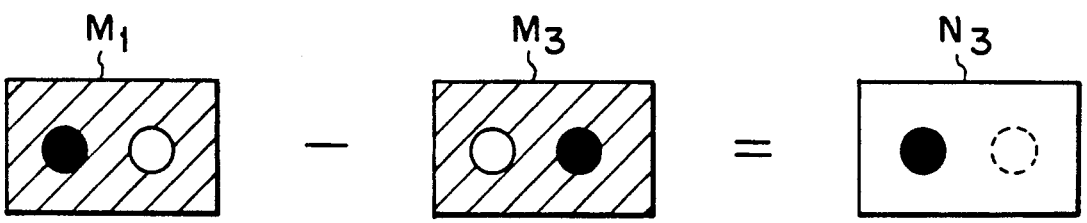

As can be seen from the foregoing, in FIGS. 7A, 7B and 7C, a image M1, M2 and M3 of a selective slice can be obtained completely. The image M1 corresponds to the image IP1 in the example of FIGS. 3 to 5. The image M3 corresponds to the image IP3 in the example of FIGS. 3 to 5. The image M2 corresponds to the image IP2 in the example of FIGS. 3 to 5.

The subtraction of the image M2 from the image M1 yields a subtraction image N1. In the case of the subtraction image N1, the blood vessel VB alone is at a high level and other portions are at zero level due to the subtraction. Moreover, the subtraction of the image M2 from the image M3 yields a subtraction image N2. In this subtraction image N2, the blood vessel VA alone is at a high level and other portions are at zero level due to the subtraction. Furthermore, the subtraction of the image M3 from the image M1 yields a subtraction image N3. In the subtraction image N3, the blood vessel VB yields a positive high-level signal, while the blood vessel VA yields a negative high-level signal. Other portions are at zero level due to the subtraction.

Figure 7D:
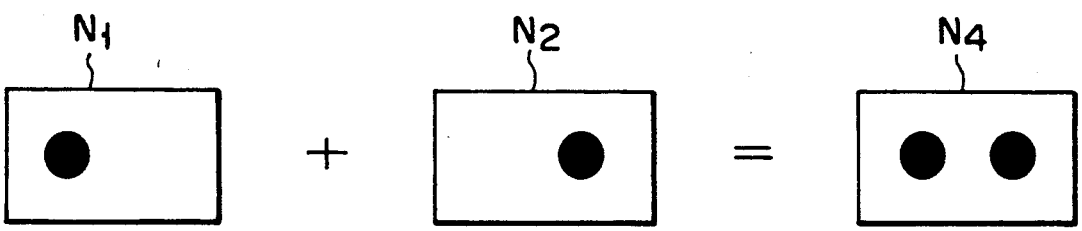

As shown in FIG. 7D, the addition of the subtraction images N1 and N2 yields an image N4 in which each of the blood vessels VA and VB is represented by a positive high-level signal and other portions are indicated by zero-amplitude signals.

The interimage subtraction process in FIG. 7A, 7B or 7C yields an image in which only the blood vessel VA is indicated, an image in which only the blood vessel VB is indicated or an image in which both the blood vessels VA and VB are indicated as having different signs depending on the direction of blood flow therein. In addition, as shown in FIG. 7D, the addition of subtraction images yields an image in which both the blood vessels VA and VB are indicated alike. The superimposition of images which comprise only one or both of the blood vessels VA and VB upon each other will permit three-dimensional presentation of VA and/or VB. As an example, FIG. 8 illustrates a three-dimensional image of blood vessels VA and VB. An imaging method and apparatus which permit visualization of only arteries, only veins or both the arteries and veins.

In the above, an example of the multi-slice acquisition was explained with respect to three slices. Of course, the number of slices may be increased and the thickness of each slice may be decreased or increased suitably. If done so, an improvement in photographing efficiency and suitable imaging of a photographing region could be expected. Setting of the slice shift amount in the multi-slice acquisition to be less than the thickness of a slice could make an improvement in the resolution in the direction of slices.

Moreover, a blood-vessel image obtained through the addition of subtraction images may be displayed in a black and white reverse mode. In the subtraction processes shown in FIGS. 7A, 7B and 7C, the minuend image and the subtrahend image may be interchanged to vary amplitudes of the blood-vessel portions.

Furthermore, display formats of the three-dimensional image of the blood vessels VA and VB include reprojection image display and animation display of reprojection images with different projection directions. In addition, as the pulse sequence employed in the present invention, not only the field-echo pulse sequence but also a spin-echo pulse sequence in which the pulse repetition time TR is made short may be employed.

Next, the other embodiment of the blood vessel imaging method of the present invention will be described.

Figure 10:
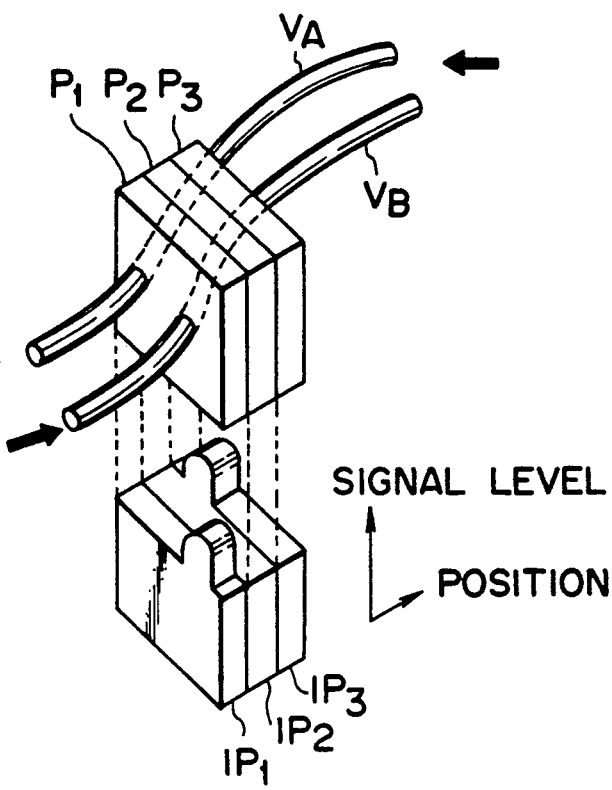
FIG. 10 is a diagrammatic representation of regions subjected to projection imaging in accordance with the pulse sequences shown in FIG. 9.

First, reference is made to FIG. 10 to describe an imaging region in the present embodiment. In the imaging region there are two blood vessels VA and VB which run substantially in parallel and which are opposite to each other in blood flow direction. For example, a region may be imagined in which an artery and a vein run substantially in parallel. Let us imagine three vertical slice regions P1, P2 and P3 which are substantially perpendicular to the blood vessels VA and VB and that the three regions are photographed using a multi-slice acquisition technique adapted to obtain projection data in a specific direction without phase encoding. In this case it is assumed that the regions are excited in the order of P1, P3 and P2. This excitation technique is what is referred to as a gapless multi-slice acquisition technique.

Next, the excitation and acquisition procedure for the above-described imaging regions is carried out in accordance with timing steps of a filed-echo pulse sequence for obtaining projection data in a specific direction without phase encoding, as shown in FIG. 9. The excitation of the regions is here effected in the order of P1, P3, P2, P1, etc. The first acquisition of projection data from the regions is made in the order of P1, P3 and P2 and then the second acquisition of projection data is made in the order of P1, P3 and P2. This projection data acquisition is made a predetermined number of times. Note that the pulse repetition period TR in the pulse sequence is set short. To improve the S/N ratio, the RF pulse (a* pulse) preferably has a flip angle of less than 90°.

Figure 11:
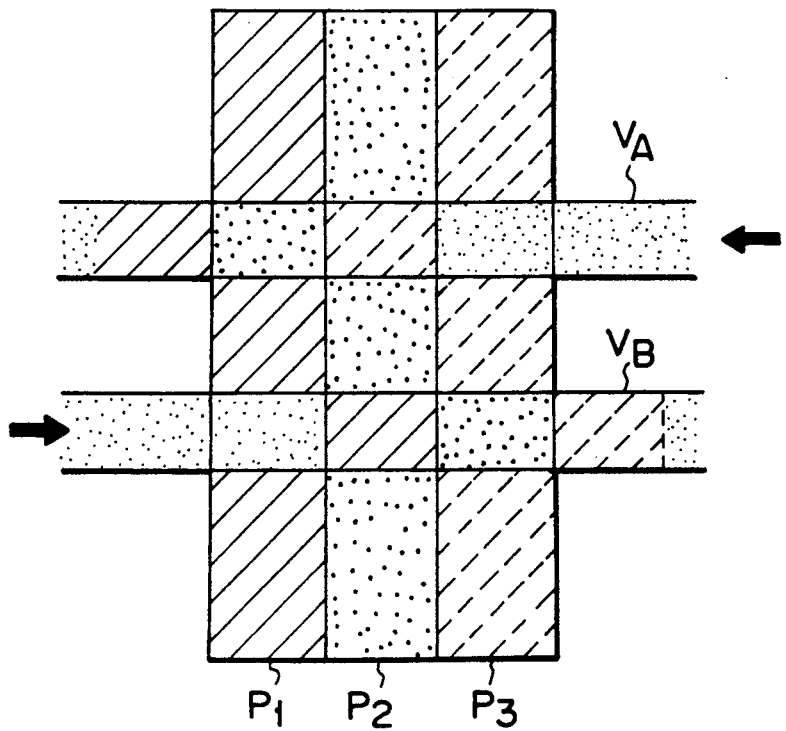
FIG. 11 is a diagram illustrating signal acquisition in the regions P1, P2 and P3 of FIG. 10.

At this point, as an example, data acquisition from the slice region P1 will be described with reference to FIG. 11. In FIG. 11, a portion indicated by oblique solid lines is the region to be excited this time, i.e., the slice region P1. A portion indicated by oblique broken lines is the region which was excited last time, i.e., the slice region P3 in a previous sequence using a different phase encoding. Moreover, a portion indicated by large dots is the region which was excited last time in a previous sequence using a different phase encoding, i.e., the slice region P2. Furthermore, portions indicated by small dots represent those which have not been excited.

As can be seen from the foregoing, the projection image IP1 associated with the region P1 will involve a relatively low-level signal from the blood vessel VA and a relatively high-level signal from the blood vessel VB. The reason is that, because of the short pulse repetition time TR, blood which has been excited in the region P2 flows into that portion of the blood vessel VA which is located in the region P1 and moreover it provides a relatively low-level signal at the time of signal acquisition, and fresh blood which has not been excited elsewhere flows into that portion of the blood vessel VB which is located in the region P1 and moreover it provides a high-level signal at the time of signal acquisition.

In the projection image IP2 associated with the region P2, the signals from the blood vessels VA and VB are both at a low level. This is because blood which has been excited in the region P3 flows into that portion of the blood vessel VA which is located in the region P2 and moreover it provides a low level signal at the time of signal acquisition, and blood which has been excited in the region P1 flows into that portion of the blood vessel VB which is located in the region P2 and moreover it provides a relatively low-level signal at the time of signal acquisition. This is also due to the short pulse repetition time TR.

Furthermore, the projection image IP3 associated with the region P3 involves a high-level signal from the blood vessel VA and a relatively low-level signal from the blood vessel VB. The reason is that fresh blood which has not been excited elsewhere flows into that portion of the blood vessel VA which is located in the region P3 and moreover it provides a high-level signal at the time of signal acquisition, and blood which has been excited in the region P1 flows into that portion of the blood vessel VB which is located in the region P3 and moreover it provides a relatively low-level signal at the time of signal acquisition. This is also due to the short pulse repetition time TR.

Next, the starting position in the multislice acquisition is shifted one slice for the subsequent excitation and data acquisition procedure. Thereby, three projection images indicated at M1, M2 and M3 are obtained at each slice position as shown in FIGS. 12A to 12D.

The projection image M1 corresponds to the projection image IP1 in the example of FIGS. 9 to 11. The projection image M2 corresponds to the projection image IP2 in the example of FIGS. 9 to 11. The projection image M3 corresponds to the projection image IP3 in the example of FIGS. 9 to 11.

Figure 12A:
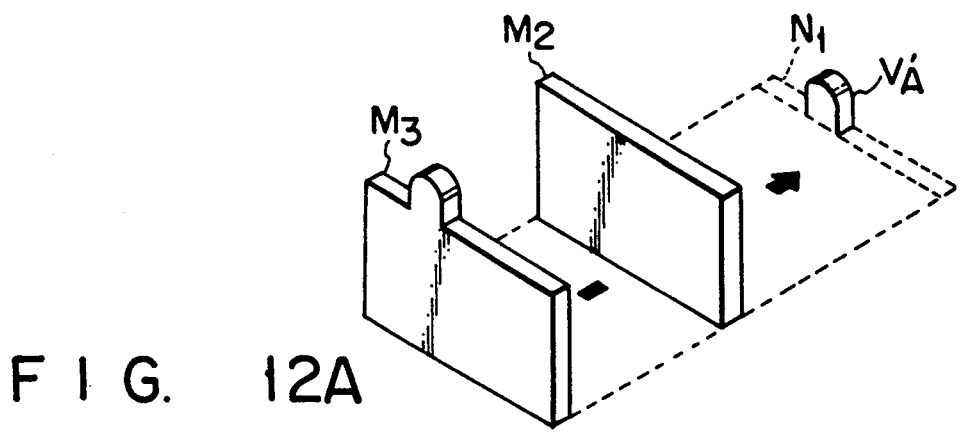
FIGS. 12A, 12B, 12C and 12D are diagrams illustrating subtraction and addition processes for blood-vessel imaging according to the second embodiment.
Figure 12B:
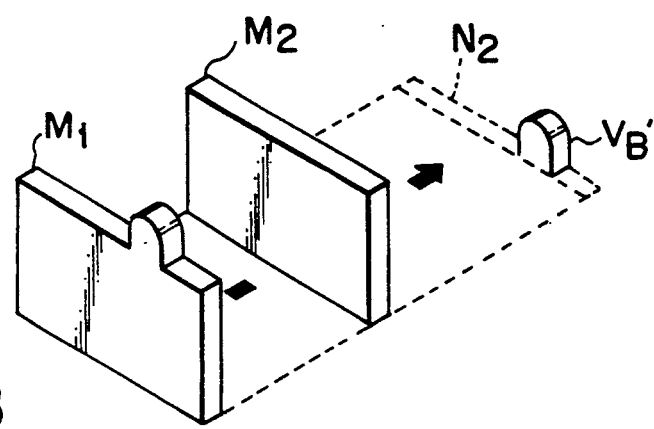
Figure 12C:
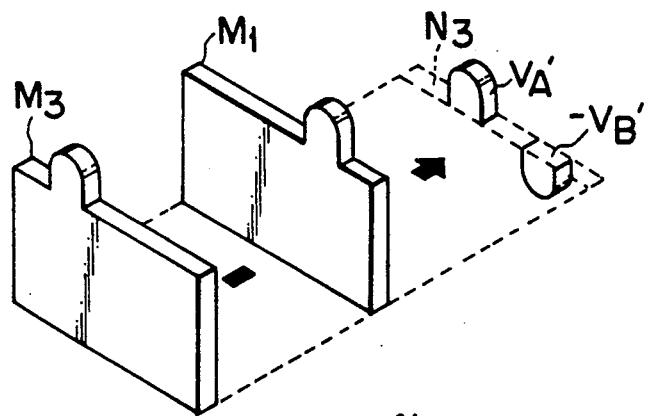

As shown in FIG. 12A, the subtraction of the image M2 from the image M1 yields a subtraction projection image N1. The subtraction projection image N1 comprises a projection image (VA') of the blood vessel VB alone. Moreover, as shown in FIG. 12B, the subtraction of the image M2 from the image M1 yields a subtraction projection image N2. This subtraction projection image N2 comprises a projection image (VB') of the blood vessel VA alone. Furthermore, as shown in FIG. 12C, the subtraction of the image M1 from the image M3 yields a subtraction projection image N3. The subtraction projection image N3 comprises projection images (VA' and VB'), with positive and minus signs, of the blood vessels VA and VB. Namely, the blood vessels VA and VB are projected separately. In addition, as shown in FIG. 12D, the addition of the subtraction projection images N1 and N2 yields an addition projection image N4, which provides positive projection data (VA', VB') of the blood vessels VA and VB alone.

Figure 12D:
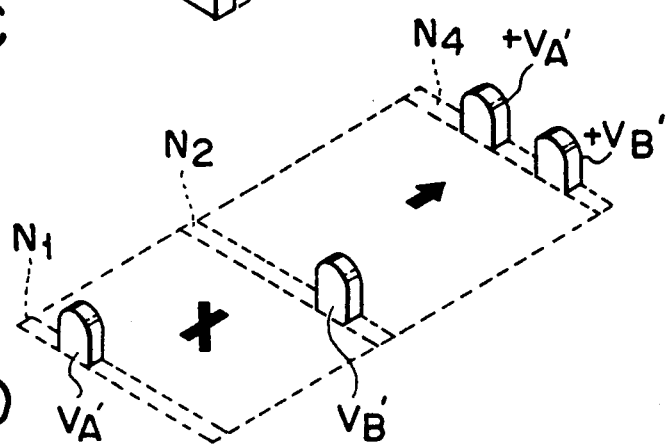
Figure 13:
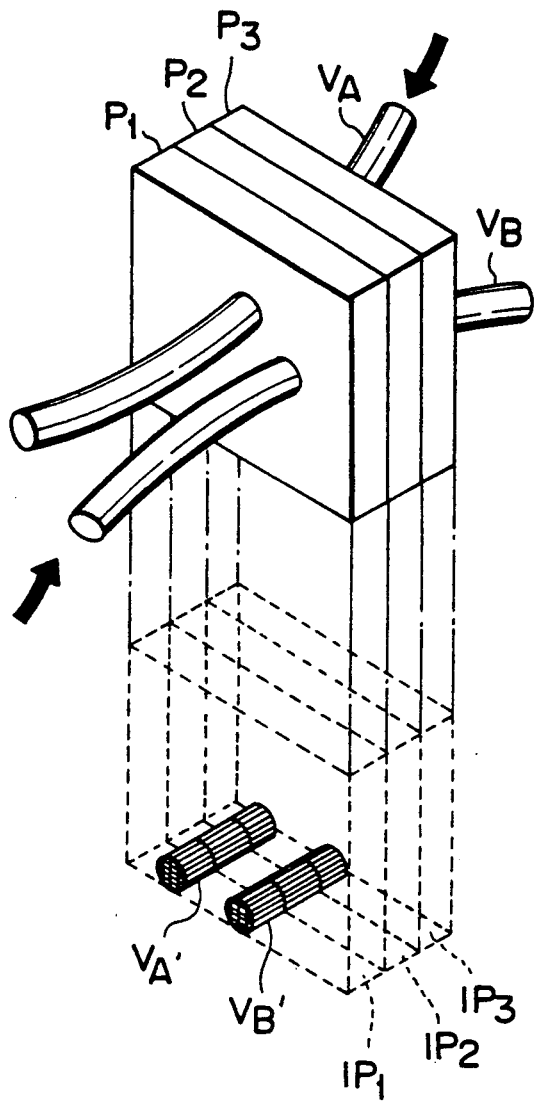
FIG. 13 is a diagrammatic representation of a projection image of two blood vessels according to the second embodiment.

By superimposing upon each other projection images comprising only the blood vessel VA, only the blood vessel VB or both of the blood vessels VA and VB which have been obtained by performing the subtraction process in FIG. 12A, 12B or 12C or the addition process in FIG. 12D for all the slice positions, projection images VA' and VB' of the blood vessels VA and VB in a specific direction are obtained as shown in FIG. 13. That is, only an artery, only a vein or both of the artery and vein can be identified or extracted alike.

In the above, an example of the multislice acquisition was explained with respect to three slices. Of course, the number of slices may be increased and the thickness of each slice may be decreased or increased suitably. If done so, an improvement in photographing efficiency and suitable imaging of a photographing region could be expected.

Figure 14:
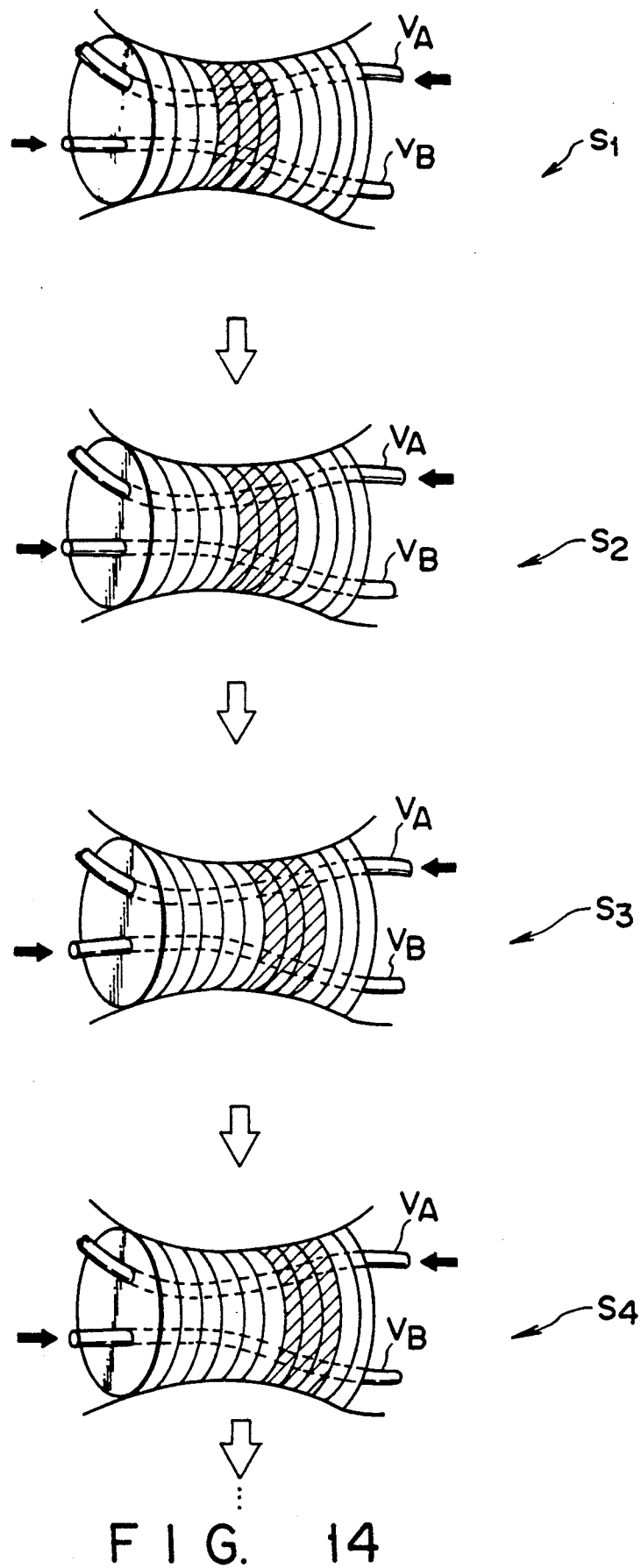
FIG. 14 is a diagram illustrating stepwise data acquisition performed while slices are shifted.

FIG. 14 is a diagram illustrating a state in which the position of a three-multislice portion indicated by oblique lines is shifted by one slice with each of steps S1 to S4. By making data acquisition in successive steps from S1 to S4 as shown in FIG. 14, two-dimensional projection images VA' and VB' in a specific direction are obtained, as shown in FIG. 16, for a imaging portion shown in FIG. 15.

Although the above description was made of the acquisition of a projection image in one direction, a projection image in any one of the orthogonal X, Y and Z-axis directions or in any direction can be acquired by adjusting the readout gradient field GR.

The shift amount of the multislice portion may be selected to be less than the thickness of a slice. If done so, the resolution in the direction of the thickness of slice will be improved.

A three-dimensional image of blood vessels VA and VB can be obtained from a group of projection images acquired from plural directions. Display formats of the three-dimensional image of blood vessels include reprojection image display and animation display of reprojection projection images obtained from different directions of projection. These display formats may be adopted as required.

As the pulse sequence used in the present invention, not only a field-echo pulse sequence but also a spin-echo pulse sequence may be adopted.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. An imaging system for imaging an imaging region containing at least two blood vessels positioned substantially parallel to one another and having blood flowing therein, in substantially opposite directions, said system comprising:

static-magnetic field applying means for applying a static-magnetic field to said imaging region;
   gradient magnetic field applying means for applying a slicing gradient magnetic field, a phase encoding gradient magnetic field, and a leading gradient magnetic field to said imaging region;
   RF pulse applying means for applying an RF pulse to said imaging region;
   collecting means for collecting magnetic resonance signals from said imaging region;
   control means for controlling said gradient magnetic field applying means, said RF pulse applying means and said collecting means to collect magnetic resonance signals from a plurality of adjacent, overlapping slicing regions and wherein within each slicing region magnetic resonance signals are collected from a plurality of slices, in a serial order, with each slice extending transverse to the directions of flow of blood in said blood vessels;
   reconstructing means for reconstructing a plurality of magnetic resonance images with each magnetic resonance image being an image of a slice on the basis of said magnetic resonance signals;
   subtraction means for subtracting between said magnetic resonance images within the same slicing region to extract at least one of blood vessels of said two blood vessels from each of said images of said plural slices reconstructed by said reconstructing means;
   addition means for separately adding the magnetic resonance images of at least one of blood vessels of said two blood vessels from each of said images obtained by said subtraction means to obtain images of at least one of blood vessels of said two blood vessels; and
   displaying means for displaying added images of at least one of blood vessels of said two blood vessels obtained by said addition means.

2. A system according to claim 1, wherein said RF pulse applying means comprises means for applying an RF pulse having a flip angle of less than 90 degrees to said imaging region.

3. A system according to claim 1, wherein said control means has means for performing a pulse sequence of an interval of short $T_R$.

4. A system according to claim 1, wherein said control means has means for performing a pulse sequence to obtain said magnetic resonance images in accordance with a multi-slice acquisition technique.

5. A system according to claim 1, wherein said control means has means for performing a pulse sequence to image adjacent overlapping slicing regions.

6. A system according to claim 1, wherein said magnetic means resonance images are cross-sectional images.

7. A system according to claim 1, wherein said magnetic means resonance images are projection images.

8. A system according to claim 4, wherein said magnetic means resonance images are cross-sectional images.

9. A system according to claim 4, wherein said magnetic means resonance images are projection images.

* * * * *